United States Patent [19]

Aberth

[11] Patent Number: 4,988,869
[45] Date of Patent: Jan. 29, 1991

[54] METHOD AND APPARATUS FOR ELECTRON-INDUCED DISSOCIATION OF MOLECULAR SPECIES

[75] Inventor: William Aberth, Palo Alto, Calif.

[73] Assignee: The Regents of the University of California, Oakland, Calif.

[21] Appl. No.: 396,888

[22] Filed: Aug. 21, 1989

[51] Int. Cl.$^5$ .............................................. H01J 49/26
[52] U.S. Cl. .................... 250/281; 250/282; 250/427; 313/362.1; 313/363.1
[58] Field of Search ............... 250/281, 282, 423 R, 250/424, 427; 313/359.1, 360.1, 361.1, 362.1, 363.1

[56] References Cited

U.S. PATENT DOCUMENTS 3,421,035 1/1969 Brubaker ............................ 250/423
3,922,428 11/1975 Cronin ............................ 313/346 R
4,731,533 3/1988 Vestal ............................ 250/293

FOREIGN PATENT DOCUMENTS 60-20442 2/1985 Japan ............................ 250/427

OTHER PUBLICATIONS

Kornelsen, J. Vac. Sci. Technol., vol. 13, No. 3, May/Jun. 1976, pp. 716–720.
McLafferty (1981), Science 214:280–287.
Kondrat and Cooks (1978), Anal. Chem. 50:81A–92A.
Johnson and Biemann, (1987), Biochem. 26:1209–1214.
Aberth (1986) Anal. Chem. 58:1221–1225.
Bricker and Russell (1986) J. Am. Chem. Soc. 108:6174–6179.
Gray et al., (1987), Rev. Sci. Instrum. 58:301.
Spindt (1968) J. Appl. Phys. 39:3504.
Spindt et al. (1976) J. Appl. Phys. 47:5248.
Spindt et al. (1984) J. Physique 45:269.
Aberth (1980) Biomed. Mass Spectrom. 7:367–371.
Aberth et al. (1982) Anal. Chem. 54:2029–2034.
Aberth and Burlingame (1984) Anal. Chem. 56:2915–2918.
Baldwin et al., (1983), Int. J. Mass Spectrom. Ion Proc. 54:97.

Primary Examiner—Jack I. Berman
Attorney, Agent, or Firm—Townsend and Townsend

[57] ABSTRACT

A tandem mass spectrometer includes an ion source, a first mass analyzer, a second mass analyzer, and a detector. An electron focusing source is provided between the first mass analyzer and the second mass analyzer in order to provide for dissociation of a parent ion beam into a plurality of daughter ion beams. In a first embodiment, the focused electron source comprises a cylindrical cathode having a concentric cylindrical anode in its interior. Control of the cathode temperature and the potential between the cathode and the anode provides a desired electron flux along the axis of the source. The second embodiment, the desired electron flux is provided by a field emission electrode.

39 Claims, 7 Drawing Sheets

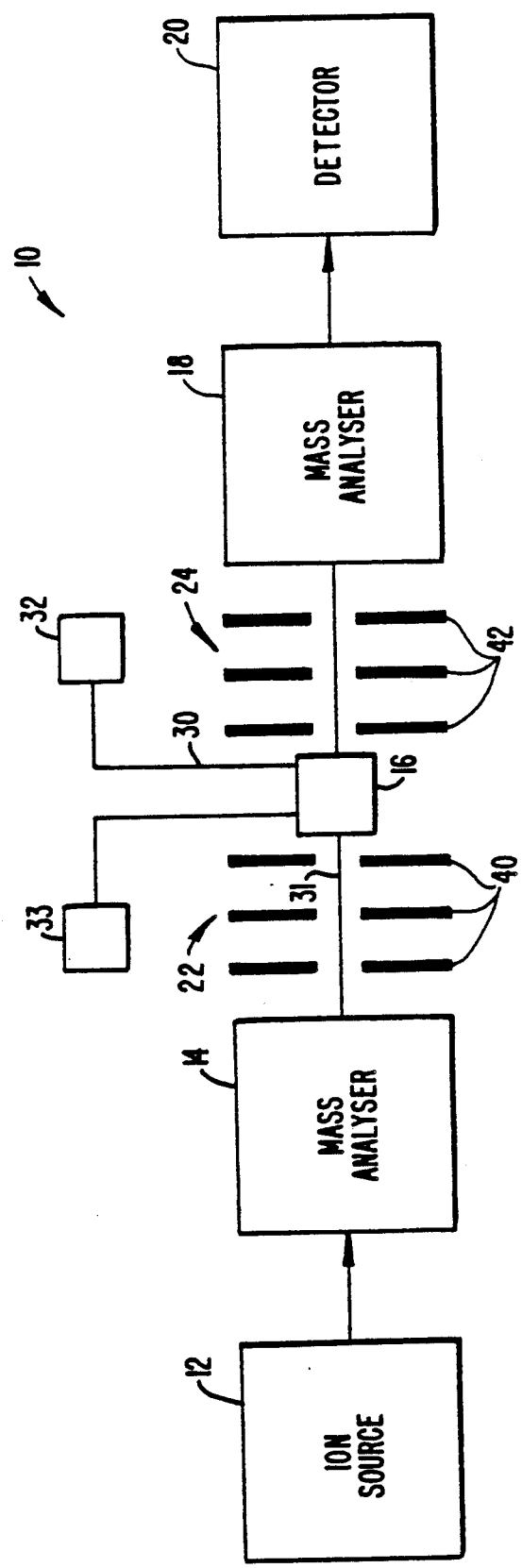
FIG._1.

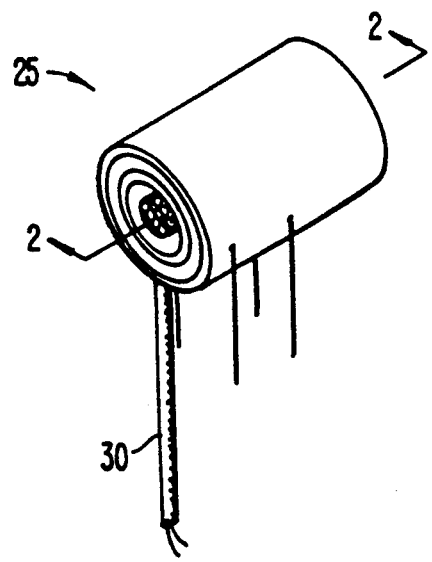
FIG._2.
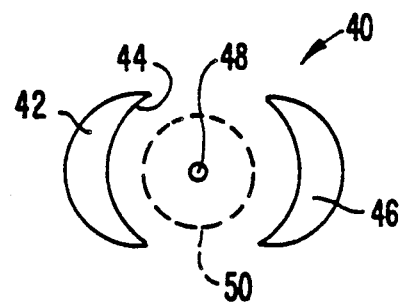
FIG._4.
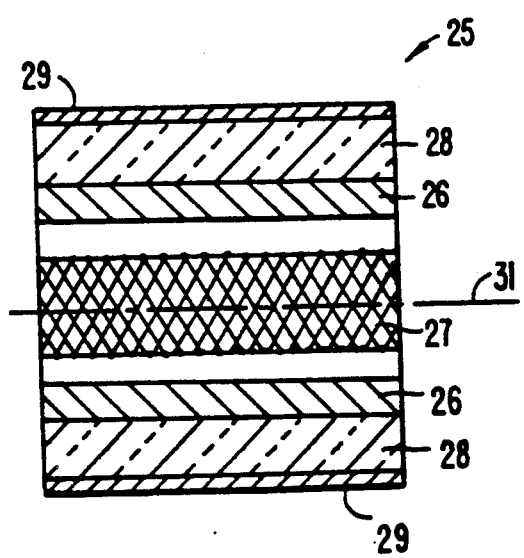
FIG._3.
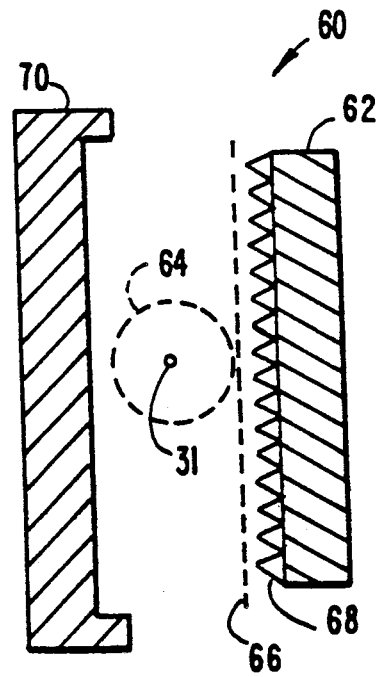
FIG._5.

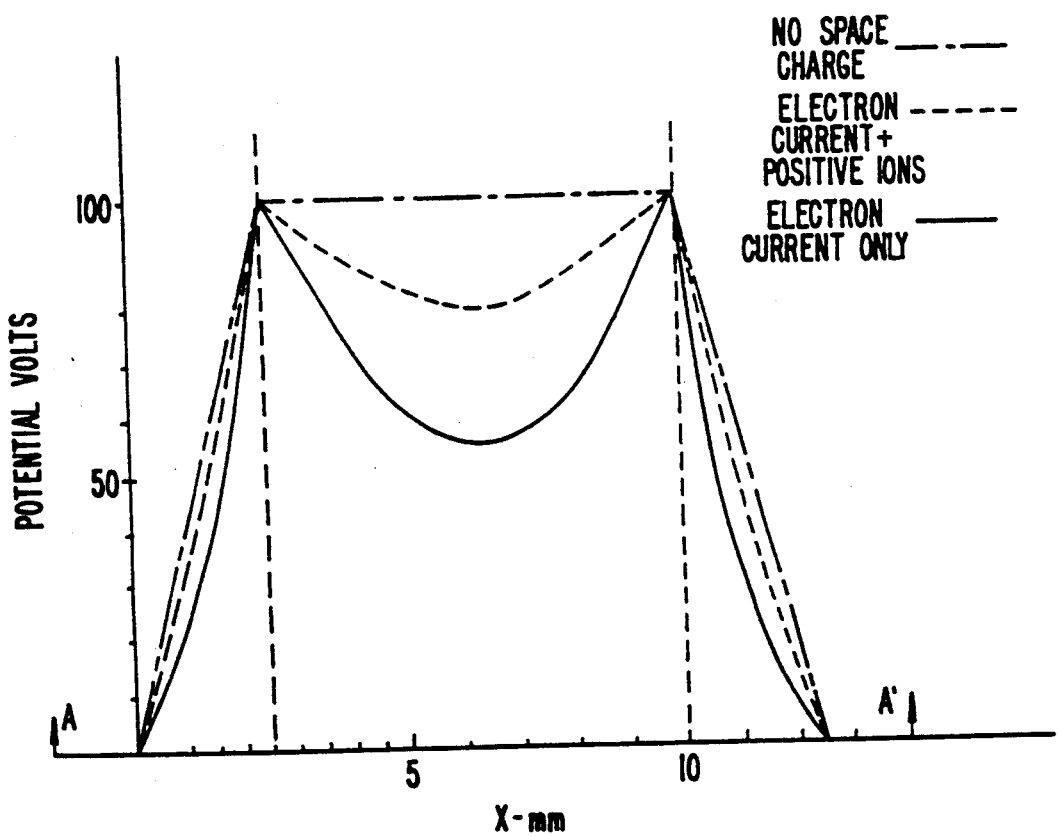
FIG_6.

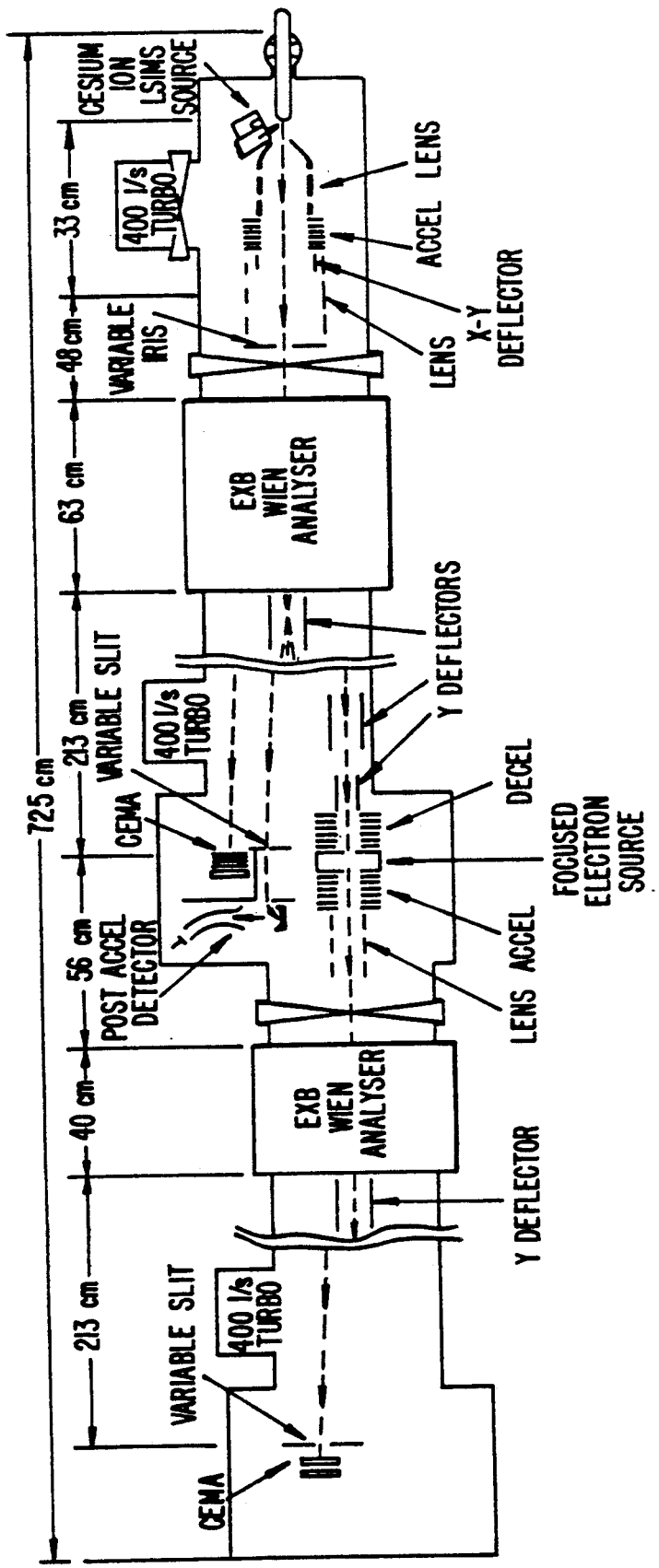
FIG._7.

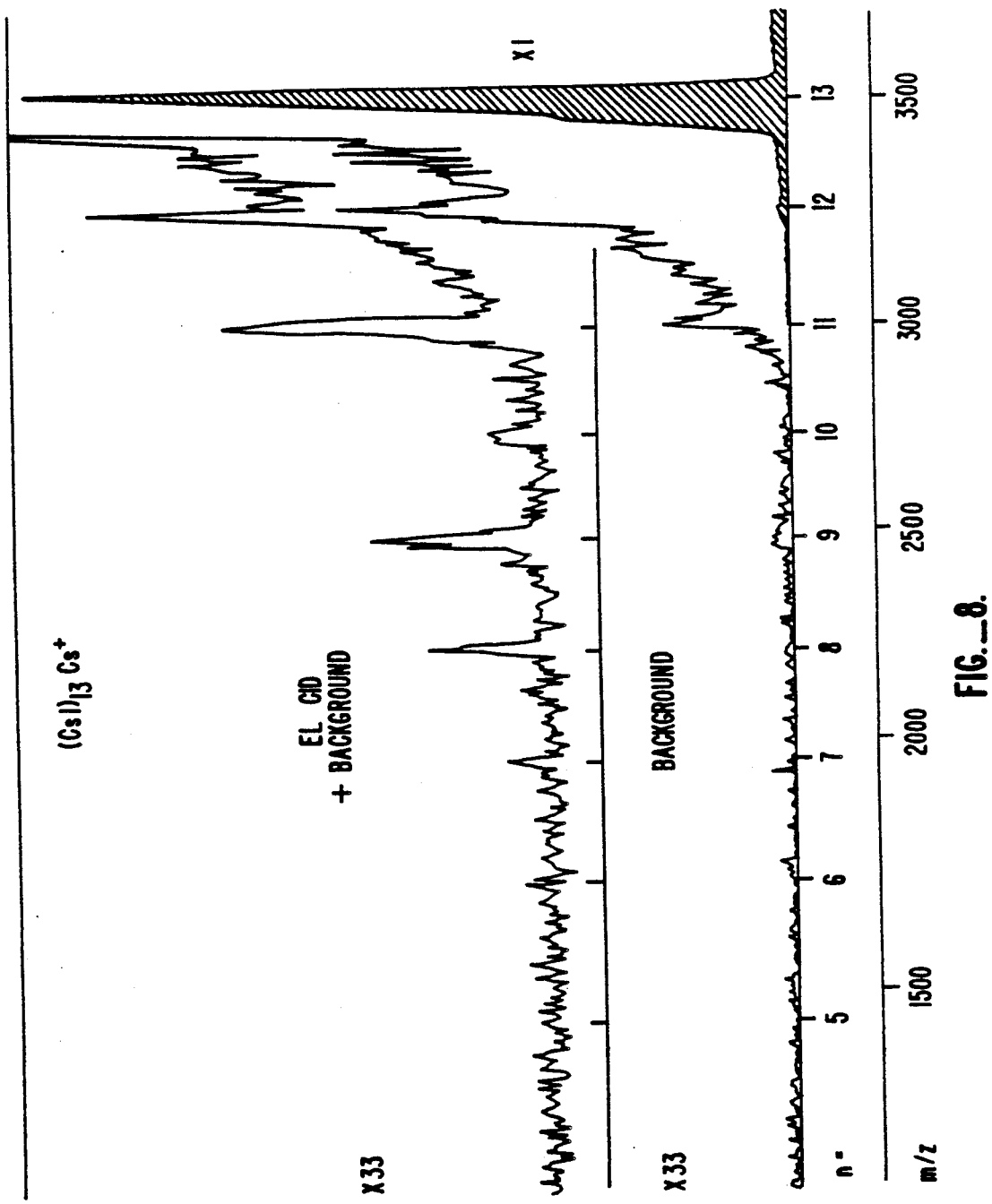
FIG._8.

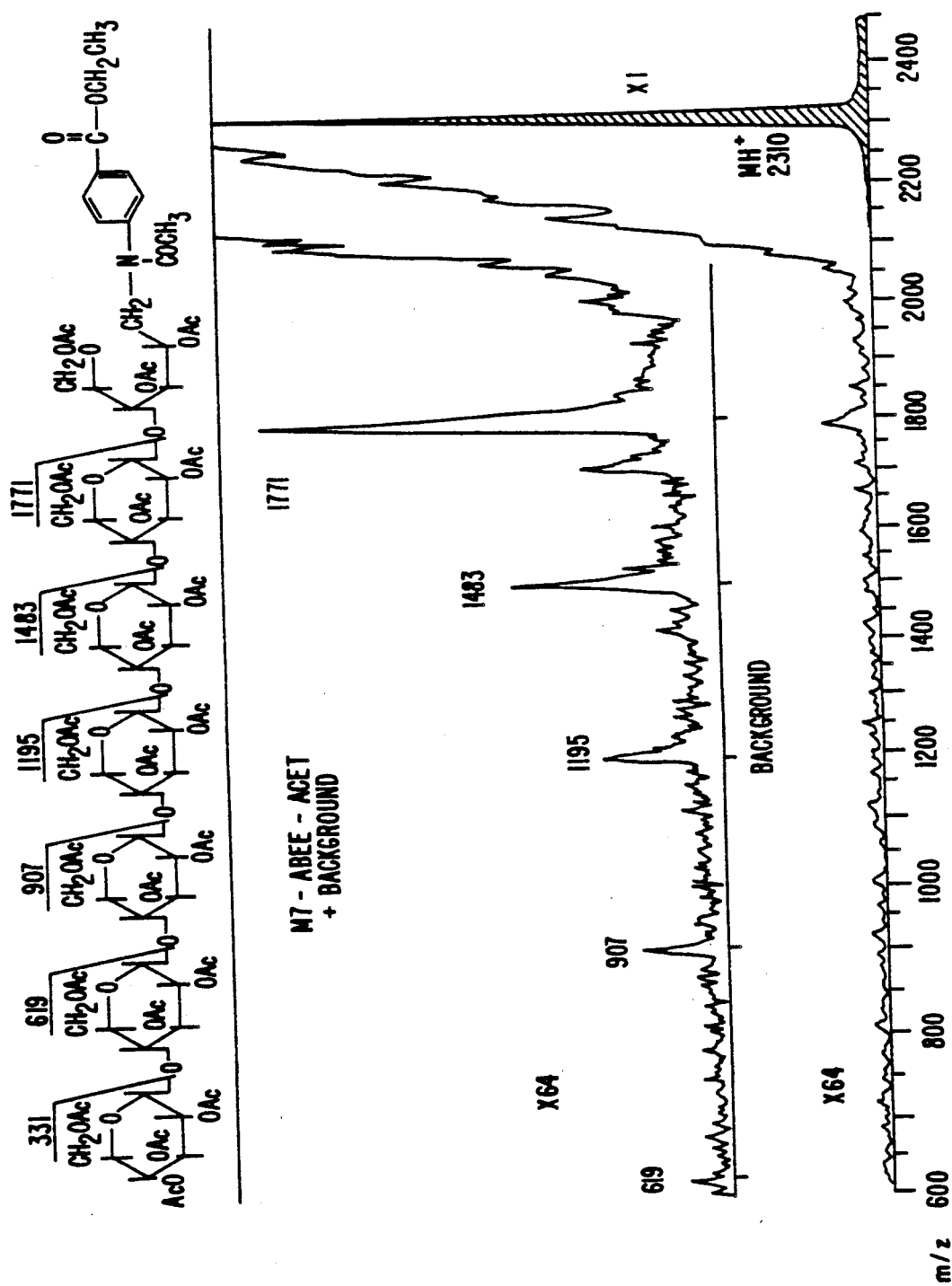
FIG._9.

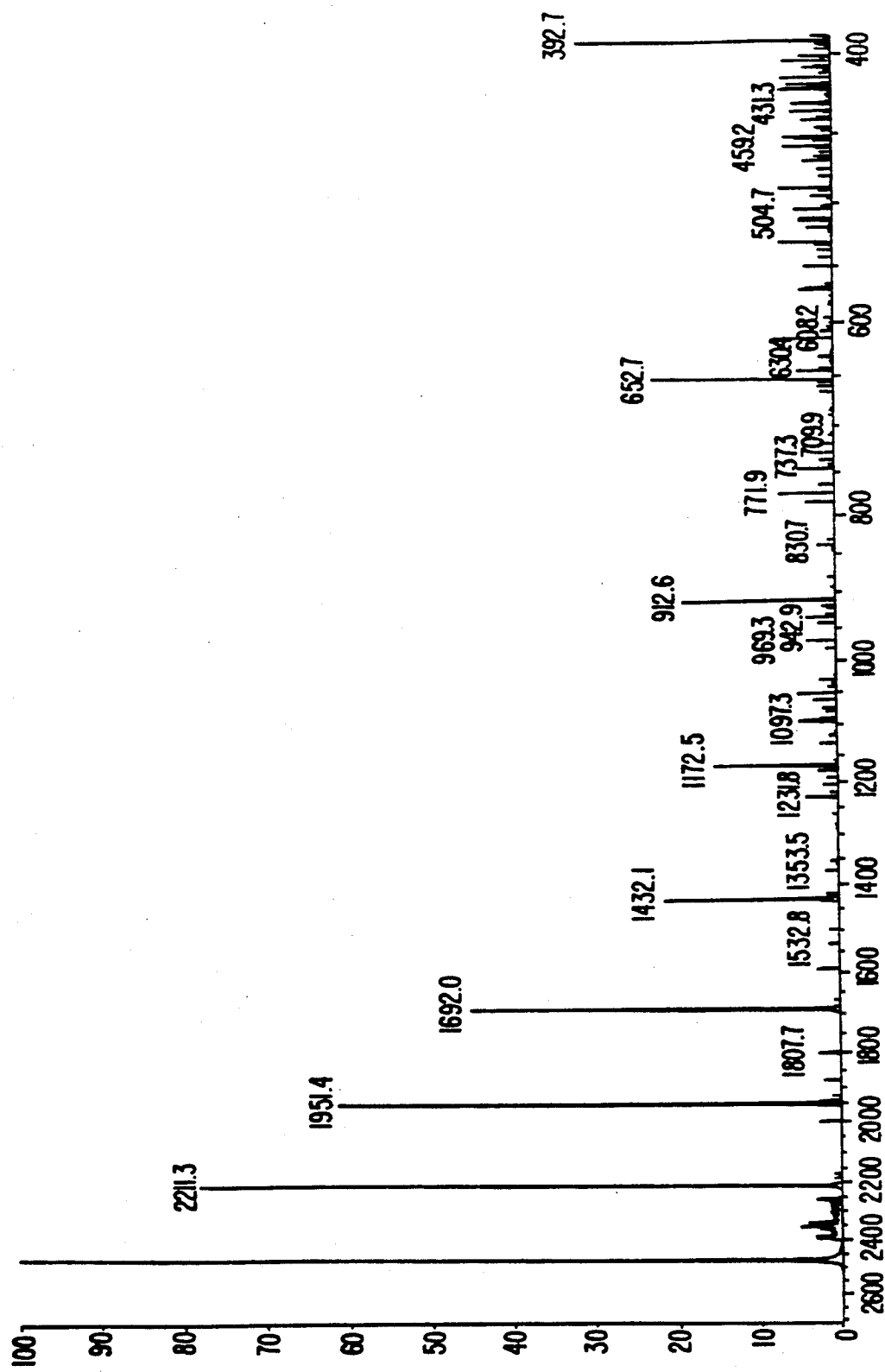
FIG._10.

METHOD AND APPARATUS FOR ELECTRON-INDUCED DISSOCIATION OF MOLECULAR SPECIES

This invention was made with Government support under Grant Contract No. R01 GM 32067 awarded by the National Institute of Health. The Government has certain rights in this invention.

BACKGROUND OF THE INVENTION

The present invention relates generally to apparatus and methods for performing mass spectrometric analyses of material samples and, more particularly, to an improved technique for dissociating parent ions into daughter ions in tandem mass spectrometers.

Mass spectrometry is an analytical technique which relies on the production of ionized fragments from a material sample and subsequent quantification of the fragments based on mass and charge. Typically, positive or negative ions are produced from the sample and accelerated to form an ion beam. Differing mass fractions within the beam are then selected using a mass analyzer, such as a single-focusing or double-focusing magnetic mass analyzer, a time-of-flight mass analyzer, a quadrupole mass analyzer, or the like. A spectrum of fragments having different masses can then be produced, and the identity of compound(s) within the material sample identified based on the spectrum.

An improved form of mass spectrometry, referred to as tandem or MS/MS mass spectrometry has been developed where a mass-selected ion beam (referred to as the parent ion stream) produced by a first mass analyzer is dissociated into a plurality of daughter ion fragments. The daughter ion fragments are then subjected to a second stage mass analyzer, allowing mass quantification of the various daughter ion fractions. Such tandem mass spectrometry has been found to provide much more information on the material being analyzed and to allow for improved discrimination between various species that may be present in a particular sample. Tandem mass spectrometry is discussed in more detail in McLafferty (1981) Science 214:280–287 and Kondrat and Cooks (1978) Anal. Chem. 50:81A–92A.

The present invention is concerned primarily with methods and apparatus for dissociating the parent ion beam into a beam of daughter ions Collision-induced dissociation (CID) is generally employed to reduce the parent ions into the daughter ions. In the predominant technique, the mass-selected parent ions are collided with gas particles, such as helium or hydrogen particles, to convert a portion of the translational energy into internal excitation energy. A number of the excited molecules will then undergo rapid unimolecular dissociation into structurally significant fragment ions, referred to as daughter ions.

The use of a gas to induce collisional dissociation has several drawbacks. First, very small sample sizes, on the order of micrograms, are often too small to provide sufficient parent ions to produce a significant stream of daughter ions. Second, the daughter ions are frequently produced over a very large energy range as a result of the kinetics of the gas collision. Such a large energy spread may necessitate the use of double focusing analyzers to obtain sufficient resolution of the daughter ion spectrum. Even with the best performing tandem equipment, however, the highest practical resolution is usually limited to about 1000 because of the signal loss resulting from the broad energy differential. See, e.g., Johnson and Biemann (1987) Biochem. 26:1209–1214. The introduction of a collision gas can also raise the pressure in the mass spectrometer which can result in poor resolution of high mass, e.g., greater than 1000 d, compounds. See, e.g., Aberth (1986) Anal. Chem. 58:1221–1225. Finally, tandem mass spectrometers using electrostatic energy analyzers often display uncertainty in mass calibration as a result of collision-associated translational energy loss. See, e.g., Bricker and Russell (1986) J. Am. Chem. Soc. 108:6174–6179.

To at least partially overcome these problems, electron-induced dissociation of the molecular species in the parent ion beam has been proposed. In U.S. Pat. No. 4,731,533, the parent ions are directed axially through a quadrupole structure while four sheets of electrons are directed inwardly through the spaces between adjacent pairs of the quadrupole rods. The electron sheets intersect generally along the parent ion beam axis, and collisions between the electrons and the parent molecules result in molecular dissociation. The patent states that such electron-induced collisions result in improved molecular dissociation efficiency and increased reproducibility. The apparatus and method described by the patent, however, suffer from certain deficiencies. In particular, use of the quadrupole structure and four separate electron filament sources renders focusing of the electrons difficult. Moreover, the production and focusing of the electrons is inefficient, requiring relatively large amounts of power to produce a sufficient number of electrons to provide the desired dissociation efficiencies. The high power requirements, in turn, place relatively high heat dissipation requirements on the system which are exacerbated by the presence of the structure in a vacuum. In addition, the long path length of the electron beam and its relatively narrow cross-section will permit space charge repulsion from the electrons to severely limit the electron beam current. Also, the RF field through which the electrons must traverse will shorten the effective duty cycle of the beam and result in the dumping of excessive power by the deflected electrons on the quadrupole rods. Moreover, the need for a tungsten cathode requires using excessive power (on the order of 500 watts) which will make cooling of the system difficult in the vacuum environment of the quadrupole system.

For these reasons, it would be desirable to provide improved apparatus and methods for the electron-induced dissociation of molecular species, particularly of mass-selected parent ion beams in tandem mass spectrometers. In particular, it would be desirable to provide apparatus and methods which achieve high dissociation efficiencies combined with low scattering losses, reduced energy spreading resulting from collisional momentum transfer, and a large transfer of internal energy. It would be further desirable to provide such advantages while utilizing a low power electron source capable of providing an intense electron flux across the path of the ion beam to be dissociated. The apparatus will preferably be of simple and compact construction and will preferably eliminate the need to provide a quadrupole structure for directing the ion beam between the first and second mass analyzers of the tandem mass spectrometer.

SUMMARY OF THE INVENTION

According to the present invention, methods and apparatus are provided for producing very high electron fluxes which are useful for causing collision-induced molecular dissociation. The methods and apparatus are particularly useful for dissociation of a parent ion beam to produce a plurality of daughter ion beams in tandem mass spectrometry. The high electron fluxes provide highly efficient molecular dissociation, while the methods and apparatus of the present invention require relatively low power consumption.

In a first particular embodiment, the electrons are emitted from a focused electron source comprising an arcuate cathode and an arcuate anode, where the cathode and anode are preferably cylindrical. By aligning the cathode and anode concentrically, the electron flux along the common axis is very high, and the desired flux for molecular dissociation can be provided with a cathode heating requirement typically below 50 watts, usually being below 25 watts, and frequently being 10 watts or lower. The electrons are focused by applying a relatively low DC voltage across the anode and cathode, typically in the range from about 100 to 300 volts, resulting in a cathode current of from about 100 to 300 ma. When used to dissociate parent ions in tandem mass spectrometers, the convergence of the electrons along the axial path results in a space charged depression of the potential field, causing a voltage minimum along the axial path. Low energy positive ions, produced by collision of the electron beam with the background gas particles, will be electrostatically attracted toward the depressed voltage region, tending to reduce the depth of the minimum. This, in turn, will have the effect of increasing the maximum permissible electron current, further increasing the dissociation efficiency. In addition to use in mass spectrometry, the electron source just described will find use as a neutral beam detector and as an ion beam generator.

In a second particular aspect of the present invention, the electrons are emitted by an electron source comprising a field emission electrode. The field emission electrode is disposed adjacent a parent ion beam path in a tandem mass spectrometer and provides a very high electron flux, typically at least 10 amps/cm$^2$, more typically at least 100 amp/cm$^2$ and above, in the region immediately adjacent the electrode. By passing the parent ion beam within about 1 cm of the surface, preferably within at least about 0.1 cm of the surface, highly efficient dissociation results with relatively low power consumption by the electrode. Positive ionization of a background gas will tend to neutralize the space charge effect of the electrode, ameliorating defocusing of the ion beam.

BRIEF DESCRIPTION OF THE DRAWINGS

FIG. 1 is a block diagram of a tandem mass spectrometer employing an electron source according to the present invention.

FIG. 2 is a perspective drawing of a first embodiment of a focused electron source according to the present invention.

FIG. 3 is a cross-sectional view taken along line 3—3 of FIG. 2.

FIG. 4 is a cross-sectional view of a second embodiment of the focused electron source of the present invention.

FIG. 5 is a cross-sectional view of an alternate embodiment of an electron source according to the present invention, employing a field emission electrode to supply the desired electron flux.

FIG. 6 is a graph illustrating the effect of the space charge distribution on the potential field within the interior of the focused electron source of FIGS. 2 and 4.

FIG. 7 illustrates the tandem Wien mass spectrometer utilized in performing certain of the examples described in the Experimental section hereinafter.

FIGS. 8–10 are mass spectrums of different molecules produced in the examples of the Experimental section.

DESCRIPTION OF THE SPECIFIC EMBODIMENTS

Tandem mass spectrometer systems 10 according to the present invention are generally configured as illustrated in FIG. 1, and include an ion source 12, a first mass analyzer 14, an electron gun device 16, a second mass analyzer 18, and a detector 20. Optionally, system 10 may also include a first beam accelerator 22 (usually a negative accelerator, i.e., a decelerator) upstream of the electron focusing device 16 as well as a second beam accelerator 24 (usually a positive accelerator) downstream of the collision plate.

The ion source 12 is capable of providing a primary ion beam composed of molecules from a material sample to be analyzed. The first mass analyzer 14 is arranged to receive primary ions from the ion source 12 and to select particular mass fractions thereof, producing a parent ion beam. The parent ion beam then strikes a flux of electrons provided by an electron source 16 (as described in more detail hereinafter), whereby the collision causes dissociation of the parent ions into smaller fragments, referred to as daughter ions. The second mass analyzer 18 receives the beam of daughter ions from the electron source 16, and is able to select a desired mass fraction thereof. The detector 20 collects and quantifies differing mass fractions of daughter ions selected by the second mass analyzer 18, and is able to produce a mass spectrum of the daughter ions which will be characteristic of the material sample being analyzed. The decelerating lens 22 and accelerating lens 24 are utilized to control the translational energy of the parent ion beam entering and exiting the electron source 16, allowing direct control over the degree of fragmentation of the parent ions.

The ion source 12, first mass analyzer 14, second mass analyzer 18, and detector 20 may be conventional components of a type generally employed in tandem mass spectrometry systems available today. The electron source 16 and associated decelerator lens 22 and accelerator lens 24, however, are unique to the present invention and will be described in much greater detail hereinbelow. Prior to such description, the requirements of the conventional components of the system will be briefly described.

The ion source 12 may be any conventional component capable of ionizing, accelerating, and focusing ions from gas, liquid, or solid material samples. Most commonly, the ion source 12 will utilize electron impact where a volatilized sample is bombarded by an electron beam to form radical cations and anions. The ionic species thus produced are usually electrostatically transferred to an ion tube, where they may be accelerated and focused using conventional apparatus. Alternatively, chemical ionization may be utilized where the volatilized sample is reacted with an ionized reactant gas, such as methane. The volatilized sample molecules are then ionized by collision with the ionized reactant gas, and the resulting ionized molecules are accelerated and focused by conventional techniques. A third technique, referred to as field ionization, produces ionic species by subjecting sample in the vapor phase to a strong electric field which can form positive ions. Field desorption is a similar technique where the sample is deposited on an anode surface and subsequently ionized and desorbed from the surface. A further common technique called FAB (fast atom bombardment) or liquid SIMS (secondary ion mass spectrometry) utilizes an energetic (2-35 keV) neutral or ionic beam directed at a target composed of the sample material dissolved in a viscous liquid solvent. The resultant sputter ions, including those of the sample material, are then formed into a beam and mass analyzed. All of these techniques for producing a primary ion beam useful in the system of the present invention are well known and amply described in the scientific and patent literature.

The first and second mass analyzers 14 and 18 may be of the same or different type, and will generally comprise conventional components, such as magnetic mass analyzers, quadrupole mass analyzers, time-of-flight mass analyzers, and Wien filter mass analyzers. The mass analyzers are required to receive an incident ion beam, either the primary ion beam from ion source 12 or the daughter ion beam from the electron focusing device 16, and select a particular fraction of the incident beam based on mass or mass-charge ratio. The use of magnetic mass spectrometers, particularly double-focusing mass spectrometers, is generally preferred for high mass and high resolution analyses. Double-focusing mass spectrometers incorporate both electrostatic and magnetic analyzers and are capable of very high resolution, allowing separation of molecule fragments in a range of 10,000 daltons (d).

Detectors 20 usable in the mass spectrometry system 10 of the present invention generally include Faraday cup detectors and electron multipliers. The detectors 20 are used to allow the plotting of mass spectra showing the relative abundance of species having a particular mass or mass-to-charge ratio. Mass spectra produced by the method of the present invention are illustrated in FIGS. 8-10, described in detail in the Experimental section hereinafter.

Referring now to FIGS. 2 and 3, a first embodiment 25 of the electron source 16 of the present invention includes a cylindrical cathode 26, a cylindrical mesh anode 27, a heater 28 disposed about the exterior surface of the cathode, and a cylindrical housing 29 which encloses the entire assembly. Conveniently, end plates (not illustrated) are provided for holding the anode 27 concentrically within the interior of the cathode 26. Electrical power leads 30 are connected to the heater 28 in order to provide the current necessary to raise the temperature of the cathode 26.

The cathode 26 is formed from a material which can, when properly heated, dispense a relatively high density of electrons, preferably at moderate temperatures below about 1000° C. and with moderate power consumption, preferably below about 100 watts, more preferably below 50 watts, and usually below 25 watts. Conveniently, the cathode is formed from a sintered metal substrate, such as tungsten, molybdenum, tantalum, titanium, or the like, preferably from tungsten. The interior surface of the cylindrical metal substrate is coated with barium oxide or other suitable salt capable of emitting electrons when raised to the desired temperature range. Such cathodes may be machined to the desired cylindrical (or other) geometry and are prolific producers of electrons at moderate temperatures. Cathodes of this type may be obtained from Spectra-Mat, Watsonville, California.

The anode 27 is formed from an electrically conductive material and is in a form which is permeable to the passage of electrons. In this way, electrons from the cathode 26 may pass through the anode 27 so that they converge upon an axial path 31 to provide the very high electron fluxes desired by the present invention. Typically, the anode 27 will be formed from a wire mesh, usually an electro-formed molybdenum mesh having a 40×40 wire count. The anode 27 will be arranged concentrically with the interior surface of the cathode 26 and will receive ions from the first mass analyzer 14 along the axial path 31 (FIG. 1).

The heater 28 will be disposed about the entire exterior surface of the cathode 26 in order to provide highly uniform heating thereof. Conveniently, the heater 28 will itself be a cylinder formed from a heat conductive material, such as alumina. The heater will be wound with resistive heating elements (not shown), conveniently formed as bifilar elements having at least two oppositely wound elements. In this way, the magnetic field induced by electron current in the elements will substantially cancel each other during operation. Such magnetic fields would otherwise interfere with the desired focusing of the electrons.

The dimensions of the focused electron source 25 are not critical with the interior diameter being sufficiently large to receive a flow of primary ions therethrough and the length being sufficient to provide the necessary electron flux in order to achieve a desired level of molecular dissociation. Typically, the anode 27 of the focused electron source 25 will have a diameter in the range from about 0.25 to 1 cm, usually being 0.5 to 0.8 cm. The internal diameter of the cathode 26 will be in the range from about 0.5 to about 2 cm, usually being in the range from about 0.6 to 1.5 cm. The length of the anode and cathode will usually be at least about 0.5 cm, more usually being about 1 cm, and usually being less than about 2 cm, and more usually being less than about 3 cm. A particular advantage of the focused electron source of the present invention is its compact size. The quadrupole electron source described in U.S. Pat. No. 4,731,533, will typically have a minimum length of about 10 cm.

In operation, the heater 28 is connected to a power supply 32 (FIG. 1) capable of providing sufficient power to achieve the desired operational temperature of the heater and cathode 26. Generally, the heater will be temperature controlled. For the exemplary barium oxide coated sintered tungsten cathode, with an internal diameter of 0.8 cm and a length of 1.3 cm, it has been found that only about 10 watts are necessary to raise the cathode surface temperature to about 900° C., a temperature at which prolific electron generation is reached.

Electrons from the cathode 26 are focused by applying a potential difference between the cathode 26 and the anode 27 using a biasing power supply 33 (FIG. 1) capable of providing a voltage in the range from about 50 to 500 volts, usually in the range from about 100 to 300 volts. Using the exemplary barium oxide coated tungsten cathode at 900° C., a biasing voltage of about 100 volts have been found to provide an electron current of about 50 milliamps. Such a current typically corresponds to a electron density along the axial path 31 in the range from about 0.5 to 2 amps/cm².

Referring now to FIG. 4, an alternate embodiment 40 of the focused electron source of the present invention is illustrated. The focused electron source 40 includes a dispenser cathode 42 having a semi-cylindrical interior surface 44. A passive cathode 46 is disposed opposite the dispenser cathode 42, and both the dispenser cathode and passive cathode are disposed concentrically about axis 48. An anode 50 is also disposed concentrically about axis 48, and a heater (not illustrated) is provided in order to raise the temperature of dispenser cathode 42. Operation of the focused electron source 40 is similar to that of focused electron source 25, except that electrons emanate only from one side of the anode 48. Electrons from the cathode 42 are focused along the axis 48 by anode 50, in a manner similar to that described above. The potential of the passive cathode 46 may be maintained either slightly below or slightly above that of the cathode 42. When it is slightly below the cathode potential (i.e., more negative), it will reflect the electrons that have passed through the anode 50 back toward the axis 48. In this way, the effect of electron density along the axis 48 is greatly increased. When the passive cathode 46 is maintained at a potential slightly above that of the cathode 42, it will collect all of the electrons emitted by the cathode.

Referring now to FIG. 5, a second type of high flux electron source suitable for use in the tandem mass spectrometer of FIG. 1 is illustrated. The electron source 60 utilizes a field emission electrode 62 to obtain very high electron fluxes along axis 31 traveled by an ion beam 64.

The field emission electrode 62 operates by applying a potential difference between a counter electrode grid 66 and an array of metallic points 68. The high field generated between the grid 66 and metal points 68 extracts electrons directly from the tips of the point and accelerates the electrons into the region just beyond (i.e., to the left in FIG. 5) of the grid 66. Within this region, very high electron densities in the range from about 10 to 100 amps/cm$^2$ can be achieved. Typically, an electron collector 70 is provided. The electron collector is maintained at the same potential as the grid 66 in order to avoid deforming the electron flux. As the intensity of the electron flux diminishes rapidly as the distance from the grid 66 increases due to space charge repulsion effects, it is necessary that the beam of parent ions 64 be directed along an axis 31 which is spaced very closely to the grid 66, preferably within about 0.3 cm, more preferably within about 0.1 cm. Methods for fabricating field emission electrodes suitable for use in the present invention are described in Gray et al. (1987) Rev. Sci. Instrum. 58:301. See also, Spindt (1968) J. Appl. Phys. 39:3504; Spindt et al. (1976) J. Appl. Phys. 47:5248; and Spindt et al. (1984) J. Physique 45:269.

The space-charged repulsion caused by the very high electron density of the field emission electrode 62 limits the length of travel of the parent ion beam. Typically, the width of the field emission electrode 62 (and hence the adjacent travel of the molecular beam 64) will be less than about 0.5 cm, more typically being less than about 0.2 cm, and preferably being less than about 0.1 cm. Such space-charged defocusing effect may be partially ameliorated by ionization of the background gas which will tend to neutralize the space charge.

Referring now to FIG. 6, an exemplary space-charged distribution in the focused electron source 25 of FIGS. 2 and 3 is illustrated. Space charge produced by the electrons will tend to depress the electrical potential along the electron path, eventually limiting the current by causing reflection and deflection of the electrons. This is illustrated by the voltage profile shown in solid line. The space-charged depression results in a voltage minimum occurring along the axial path of the ion beam (illustrated as line 31 in FIG. 3). Low energy positive ions produced by the collision of the electron beam with background gas particles will be electrostatically attracted toward the depressed voltage region and will tend to reduce the depth of the depression, as illustrated in the broken line in FIG. 6. Such an effect will increase the maximum permissible electron current, thus increasing the dissociation efficiency of the device. A higher degree of neutralization of the space charge also results from enhancing positive ion production and decreasing leakage of the positive ions from the potential well region.

Maintaining good geometrical symmetry of the focused electron source 25 and extending the anode 27 beyond the ends of the cathode 26 will have the effect of raising the potential along the beam axis 31 at the beam entrance and exit ends. This in turn reduces the positive ion leakage. Positive ion production can be enhanced by introducing a small amount of inert gas to the collision region, e.g., argon or nitrogen, typically to a level of about $10^{-7}$ Torr. Such a low gas pressure is not sufficient to significantly interfere with the passage of the ion beam or to cause deterioration of the cathode surface.

Referring again to FIG. 1, the first accelerating lens 22 will generally employ a plurality of individual conductive plates 40 arranged in the conventional manner of a focusing lens. The plates 40, as well as the electron source 16 will usually be electrically biased in order to reduce the energy of the incident beam of parent ions. Typically, the parent ions passing through the electron source 16 will have an energy in the range from about 100 to 2000 eV. Similarly, the second accelerating lens 24 will also include a plurality of plates 42 arranged as a focusing lens, usually being electrically biased together with electron source 16 in order to increase the energy and focus the daughter ion beam 34 released from the source 16.

The following examples are offered by way of illustration, not by way of limitation.

EXPERIMENTAL

The experimental arrangement for demonstrating the present invention is shown in FIG. 7. A tandem Wien mass spectrometer (Aberth (1980) Biomed. Mass Spectrom. 7:367-371, and (1986) Anal. Chem. 58:1221-1225) operating with an accelerating voltage of 25 keV was used. The Wien spectrometer utilizes superimposed electric (E) and magnetic (B) fields to mass separate beam ions. The ion source utilizes a 10 keV cesium ion gun (Aberth et al. (1982) Anal. Chem. 54:2029-2034) to sputter sample molecular ions, which were then extracted from the source using an immersion lens geometry (Aberth and Burlingame (1984) Anal. Chem. 56:2915-2918), and accelerated to 25 keV for mass separation by Wien MS-1. The mass selected ion beam was then decelerated from 25 keV to the desired energy for dissociation by the focused electron source. The resolution of Wien MS-1 was set at 500 (full width at half maximum) while that of Wien MS-2 was set at about 80.

The focused electron source was of the type illustrated in FIG. 4, where the cathode and passive cathode were aligned to form a complete cylindrical surface having an inside diameter of 7/16 inch and a length of ½ inch. The cathode was formed from sintered tungsten having barium oxide deposited on its interior (concave) surface. An anode consisting of a molybdenum grid in the form of a cylinder having a diameter of 5/16 inch and a length of ½ inch was concentrically inserted inside the cathode structure. The cathode was heated to approximately 950° C. with 10 watts of heater power, and electrons extracted by applying a DC bias of approximately 300 volts across the anode and cathode. The resulting cathode emission current was approximately 50 milliamps.

FIG. 8 is a spectrum obtained from mass analysis of the $(CsI)_{13}Cs^+$ cluster ion (3513d) using the mass spectrometry system just described. A comparison of this spectrum with the background (focused electron source off) spectrum demonstrates that 2.4% of the parent beam undergoes electron-induced dissociation while 1.6% of the beam undergoes metastable decay. This compares favorably with the results of helium collision-induced dissociation as reported by Baldwin et al. (1983) Int. J. Mass Spectrom. Ion Proc. 54:97, where 1% of the parent beam underwent collision-induced dissociation and 0.3% of the beam underwent metastable decay.

FIG. 9 is a spectrum obtained from mass analysis of a peracetyl maltoheptose derivative described by Bricker and Russell (1986) J. Am. Chem. Soc. 108:6174 using the mass spectrometry system just described. Partial acetyolysis of peracetyl oligosaccharides yields a mixture of oligomers from preferential hydrolysis of 1,6-linkages. Since the protonated molecular ions of these peracetylated oligosaccharide products do not readily fragment, it is necessary to carry out MS-MS to obtain their fragmentation patter. The spectrum obtained with electron-induced dissociation according to the present invention clearly illustrates that the glycosodic cleavages can be induced yielding stable oxonium stabilized sequence ions from the non-reducing terminus of this 1,4-linked oligomer.

FIG. 10 is a spectrum obtained from mass analysis of $(CsI)_9Cs^+$ cluster ion (2473d) using a focused electron source of the type illustrated in FIGS. 2 and 3. The cathode was a sintered tungsten cylinder having an internal diameter of 0.312 inches, a length of 0.5 inches, and barium oxide deposited on its inner surface. The anode was a molybdenum grid in the form of a cylinder having a length of 0.5 inches and a diameter of 0.188 inches and was concentrically mounted within the cylinder. The cathode was heated to approximately 950° C. with 35 watts of heater power and electrons were extracted by applying a DC bias of approximately 150 volts across the anode and cathode. The resulting cathode emission current was approximately 100 milliamps. The focused electron source was installed in the Kratos Analytical MS/MS instrument at the University of California, San Francisco. All possible cluster fragments that are represented in the spectrum of FIG. 10 indicate a total fragmentation efficiency of about 5% of the parent ion. The parent ion energy in the electron beam was about 2 keV.

Although the foregoing invention has been described in detail for purposes of clarity of understanding, it will be obvious that certain modifications may be practiced within the scope of the appended claims.

What is claimed is:

1. An apparatus capable of radially focusing electrons along a predefined axis, said apparatus comprising:
   an arcuate anode having a substantially fixed radius relative to said predefined axis, said anode being permeable to the passage of electrons;
   an arcuate cathode disposed concentrically about the anode, wherein the anode and cathode have substantially the same axial length of at least about 0.5 cm;
   means for heating the cathode to generate electrons; and
   means for applying a potential difference across the anode and cathode to focus the electrons from the cathode along said predefined axis.

2. An apparatus as in claim 1, wherein the anode is a cylindrical mesh.

3. An apparatus as in claim 2, wherein the cathode has a cylindrical geometry.

4. An apparatus as in claim 2, wherein the cathode comprises at least one semi-cylindrical segment.

5. An apparatus as in claim 3, wherein the anode has a diameter in the range from about 0.25 to 1 cm and the cathode has a diameter in the range from about 0.5 to 2 cm.

6. An apparatus as in claim 5, wherein the anode and cathode each have a length in the range from about 0.5 to 3 cm.

7. An apparatus as in claim 1, wherein the cathode is composed of a sintered metal coated with barium oxide.

8. An apparatus as in claim 1, further comprising a resistive heater concentrically disposed about the exterior surface of the cathode.

9. A mass spectrometer comprising:
   means for generating a primary ion beam from a material sample;
   first mass analyzing means for selecting a beam of parent ions from the primary ion beam;
   an arcuate anode having a substantially fixed radius relative to a preselected axis said anode being permeable to the passage of electrons and being disposed to receive at least a portion of the beam of parent ions along said preselected axis;
   an arcuate cathode disposed concentrically about the anode;
   means for heating the cathode to generate electrons;
   means for applying a potential difference across the anode and cathode to focus the electrons from the cathode along said preselected axis, whereby collision of the parent ions with said focused electrons dissociates the parent ions into smaller daughter ions;
   second mass analyzing means for selecting a mass fraction of the beam of daughter ions; and
   means for detecting the selected mass fraction of the daughter ions.

10. A mass spectrometer as in claim 9, further comprising:
    means for decelerating the parent ions between the first mass analyzing means and the preselected axis; and
    means for accelerating the daughter ions from the preselected axis.

11. A mass spectrometer as in claim 9, wherein the first mass analyzing means is a magnetic focusing mass analyzer, a time-of-flight mass analyzer, a quadrupole mass analyzer, or a Wien filter mass analyzer.

12. A mass spectrometer as in claim 9, wherein the second mass analyzing means is a magnetic focusing mass analyzer, a Wien filter mass analyzer, a time-offflight mass analyzer, a quadrupole mass analyzer, or an ion cyclotron resonance mass analyzer.

13. A mass spectrometer as in claim 9, wherein the anode is a cylindrical mesh.

14. A mass spectrometer as in claim 13, wherein the cathode has a cylindrical geometry.

15. A mass spectrometer as in claim 13, wherein the cathode comprises at least one semi-cylindrical segment.

16. A mass spectrometer as in claim 14, wherein the anode has a diameter in the range from about 0.25 to 1 cm and the cathode has a diameter in the range from about 0.5 to 2 cm.

17. A mass spectrometer as in claim 16, wherein the anode and cathode each have a length in the range from about 0.5 to 3 cm.

18. A mass spectrometer as in claim 9, wherein the cathode is composed of a sintered metal coated with barium oxide.

19. A mass spectrometer comprising:
   means for generating a primary ion beam from a material sample;
   first mass analyzing means for selecting a beam of parent ions from the primary ion beam and for directing the beam of parent ions along an axial path;
   an array of field emission points located adjacent to the axial path;
   a counter electrode disposed between the array of field emission points and the axial path;
   means for applying a potential difference between the emission points and the counter electrode, whereby an intense electron flux is produced across the axial path and collision of the parent ions with the electron flux dissociates the parent ions into smaller daughter ions;
   second mass analyzing means for selecting a mass fraction of the beam of daughter ions; and
   means for detecting the selected mass fraction of the daughter ions.

20. A mass spectrometer as in claim 19, further comprising:
   means for decelerating the parent ions between the first mass analyzing means and the preselected axis; and
   means for accelerating the daughter ions from the preselected axis.

21. A mass spectrometer as in claim 19, wherein the first mass analyzing means is a magnetic focusing mass analyzer, a time-of-flight mass analyzer, a quadrupole mass analyzer, or a Wien filter mass analyzer.

22. A mass spectrometer as in claim 19, wherein the second mass analyzing means is a magnetic focusing mass analyzer, a time-of-flight mass analyzer, a quadrupole mass analyzer a Wien filter mass analyzer, or an ion cyclotron resonance mass analyzer.

23. A mass spectrometer as in claim 19, wherein the array includes at least about 1000 field emission points per cm$^2$.

24. A mass spectrometer as in claim 19, further comprising an electron collector disposed toward the array of field emission points on the opposite side of the axial path, where the electron collector is maintained at substantially the same potential as the counter electrode.

25. A method for analyzing the mass of a material sample, said method comprising:
   (a) generating a primary ion beam from the sample;
   (b) selecting a beam of parent ions having a predetermined mass distribution from the primary ion beam;
   (c) generating electrons from a concave surface of an arcuate cathode;
   (d) focusing said electrons along an axial path using an arcuate anode which is biased relative to said cathode;
   (e) focusing the beam of parent ions along the axial path, whereby collision between the parent ions and the electrons results in dissociation of the parent ions into smaller daughter ions;
   (f) selecting a fraction of the daughter ions having a predetermined mass distribution; and
   (g) quantifying the mass fraction of daughter ions.

26. A method as in claim 25, wherein steps (a) through (g) are repeated to select fractions of the daughter ions having different mass distributions to produce a mass spectrum of the daughter ions.

27. A method as in claim 25, wherein the parent ions are selected by a magnetic focusing mass analyzer, a time-of-flight mass analyzer, a quadrupole mass analyzer, or a Wien filter mass analyzer.

28. A method as in claim 25, wherein the fraction of daughter ions is selected by a magnetic focusing mass analyzer, a time-of-flight mass analyzer, a quadrupole mass analyzer, a Wien filter mass analyzer, or an ion cyclotron resonance mass analyzer.

29. A method as in claim 25, wherein the parent ion beam is decelerated prior to collision with the electrons and the resulting daughter ions are accelerated prior to mass fraction selection.

30. A method as in claim 25, wherein the parent ion beam is accelerated prior to collision with the electrons and the resulting daughter ions are accelerated prior to mass fraction selection.

31. A method as in claim 25, wherein the cathode is sintered metal having a coating of barium oxide on its concave surface and the electrons are generated by heating to a temperature in the range from about 900 to 1,000° C.

32. A method as in claim 31, wherein the electrons are focused by applying a voltage in the range from about 100 to 300 volts across the anode and cathode.

33. A method for analyzing the mass of a material sample, said method comprising:
   (a) generating a primary beam from the sample;
   (b) selecting a beam of parent ions having a predetermined mass distribution from the primary ion beam;
   (c) generating an electron flux from an array of field emission points located adjacent an axial path;
   (d) focusing the beam of parent ions along the axial path, whereby collision between the parent ions and the electrons results in dissociation of the parent ions into smaller daughter ions;
   (e) selecting a fraction of the daughter ions having a predetermined mass distribution; and
   (f) quantifying the mass fraction of daughter ions.

34. A method as in claim 33, wherein steps (a) through (f) are repeated to select fractions of the daughter ions having different mass distributions to produce a mass spectrum of the daughter ions.

35. A method as in claim 33, wherein the parent ions are selected by a magnetic focusing mass analyzer, a time-of-flight mass analyzer, a quadrupole mass analyzer, or a Wien filter mass analyzer mass analyzer.

36. A method as in claim 33, wherein the fraction of daughter ions is selected by a magnetic focusing mass analyzer, a time-of-flight mass analyzer, a quadrupole mass analyzer, a Wien filter mass analyzer, or an ion cyclotron resonance mass analyzer.

37. A method as in claim 33, wherein the parent ion beam is decelerated prior to collision with the electrons and the resulting daughter ions are accelerated prior to mass fraction selection.

38. A method as in claim 33, wherein the parent ion beam is accelerated prior to collision with the electrons and the resulting daughter ions are accelerated prior to mass fraction selection.

39. A method as in claim 33, wherein the electron flux is at least about 10 amps/cm$^2$.

* * * * *